United States Patent
Kyakuno

(10) Patent No.: US 10,591,940 B2
(45) Date of Patent: Mar. 17, 2020

(54) CURRENT OUTPUT CIRCUIT

(71) Applicant: YOKOGAWA ELECTRIC CORPORATION, Musashino-shi, Tokyo (JP)

(72) Inventor: Toshihiko Kyakuno, Musashino (JP)

(73) Assignee: YOKOGAWA ELECTRIC CORPORATION, Musashino-shi, Tokyo (JP)

( * ) Notice: Subject to any disclaimer, the term of this patent is extended or adjusted under 35 U.S.C. 154(b) by 0 days.

(21) Appl. No.: 16/280,341

(22) Filed: Feb. 20, 2019

(65) Prior Publication Data

US 2019/0265740 A1 Aug. 29, 2019

(30) Foreign Application Priority Data

Feb. 28, 2018 (JP) .................. 2018-034565

(51) Int. Cl.

| G05F 1/575 | (2006.01) |
|---|---|
| H02M 3/335 | (2006.01) |
| H02M 1/12 | (2006.01) |
| H02M 1/15 | (2006.01) |
| H02M 3/156 | (2006.01) |
| H02M 1/00 | (2006.01) |
| G01R 19/04 | (2006.01) |

(52) U.S. Cl.
CPC ........ *G05F 1/575* (2013.01); *H02M 3/33507* (2013.01); *G01R 19/04* (2013.01); *H02M 1/12* (2013.01); *H02M 1/15* (2013.01); *H02M 3/156* (2013.01); *H02M 2001/0003* (2013.01); *H02M 2001/0006* (2013.01); *H02M 2001/007* (2013.01); *H02M 2001/0019* (2013.01); *H02M 2001/0022* (2013.01); *H02M 2001/0025* (2013.01); *H02M 2003/1566* (2013.01)

(58) Field of Classification Search
CPC .......... G05F 1/575; H02M 2003/1566; H02M 2001/0019; H02M 1/12; H02M 2001/0006; H02M 2001/0003; H02M 3/156; H02M 1/15; H02M 2001/0025
See application file for complete search history.

(56) References Cited

U.S. PATENT DOCUMENTS

| 7,893,675 B2* | 2/2011 | Sheahan | ............... H02M 3/156 323/283 |
|---|---|---|---|
| 8,253,400 B2* | 8/2012 | Irissou | .................. H02M 3/156 323/282 |

(Continued)

FOREIGN PATENT DOCUMENTS

| EP | 3059846 A1 | 8/2016 |
|---|---|---|
| JP | 4207114 B2 | 1/2009 |
| JP | 2016100960 A | 5/2016 |

*Primary Examiner* — Kyle J Moody
(74) *Attorney, Agent, or Firm* — Kenja IP Law PC

(57) ABSTRACT

A current output circuit includes a DC-DC power source, a current output unit, and a voltage detector. The DC-DC power source controls an output voltage. The current output unit operates at the output voltage of the DC-DC power source, generates a current signal based on a control instruction, and outputs the current signal to a load. The voltage detector holds the voltage of the load at the peak thereof and outputs the voltage of the load held at the peak to the DC-DC power source as a voltage signal. The DC-DC power source controls the output voltage on the basis of the voltage signal.

17 Claims, 9 Drawing Sheets

(56) References Cited

U.S. PATENT DOCUMENTS

| | | | |
|---|---|---|---|
| 9,608,520 B2* | 3/2017 | Peng | H02M 3/156 |
| 9,780,672 B1* | 10/2017 | Li | H05B 33/089 |
| 9,958,888 B2* | 5/2018 | Wei | G05F 1/56 |
| 10,063,143 B1* | 8/2018 | Fan | H02M 3/158 |
| 10,320,285 B2* | 6/2019 | Kim | H02M 1/4225 |
| 2013/0223108 A1 | 8/2013 | Xu | |
| 2017/0373595 A1* | 12/2017 | Huang | H02M 3/158 |
| 2018/0062527 A1* | 3/2018 | Lu | H02M 3/33507 |

* cited by examiner

CURRENT OUTPUT CIRCUIT

CROSS-REFERENCE TO RELATED APPLICATION

The present application claims priority to and the benefit of Japanese Patent Application No. 2018-34565 filed Feb. 28, 2018, the entire contents of which are incorporated herein by reference.

TECHNICAL FIELD

The present disclosure relates to a current output circuit.

BACKGROUND

A known current output circuit outputs a current signal that is based on a control instruction to a load. For example, see patent literature (PTL) 1.

CITATION LIST

Patent Literature

PTL 1: JP4207114B2

SUMMARY

A current output circuit according to an embodiment includes a direct current-direct current (DC-DC) power source, a current output unit, and a voltage detector. The DC-DC power source controls an output voltage. The current output unit operates at the output voltage of the DC-DC power source, generates a current signal based on a control instruction, and outputs the current signal to a load. The voltage detector holds the voltage of the load at the peak thereof and outputs the voltage of the load held at the peak to the DC-DC power source as a voltage signal. The DC-DC power source controls the output voltage on the basis of the voltage signal.

DETAILED DESCRIPTION

Figure 1:
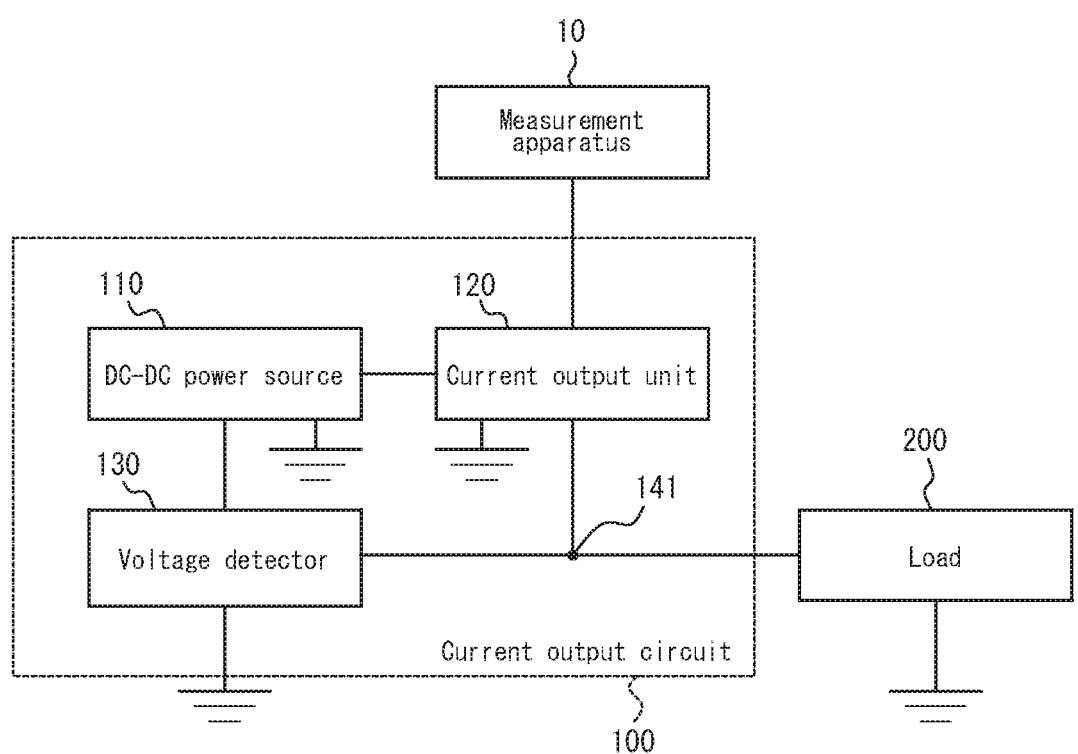
FIG. 1 is a block diagram schematically illustrating an example configuration of a current output circuit according to an embodiment.

A signal from a load, noise, or the like may be inputted to a current output circuit. The current output circuit can control the magnitude of a power-source voltage on the basis of the voltage of the load. When the current output circuit controls the magnitude of the power-source voltage, the result of control may be affected by the signal from the load, noise, or the like.

A current output circuit according to an embodiment includes a direct current-direct current (DC-DC) power source, a current output unit, and a voltage detector. The DC-DC power source controls an output voltage. The current output unit operates at the output voltage of the DC-DC power source, generates a current signal based on a control instruction, and outputs the current signal to a load. The voltage detector holds the voltage of the load at the peak thereof and outputs the voltage of the load held at the peak to the DC-DC power source as a voltage signal. The DC-DC power source controls the output voltage on the basis of the voltage signal. This configuration allows the output voltage of the DC-DC power source to have sufficient headroom while also making the circuitry included in the current detection circuit less prone to oscillation. Consequently, the current output circuit can operate stably.

In a current output circuit according to an embodiment, the voltage detector may include an input unit and an output unit. The input unit may transition to one of a first state for acquiring the voltage of the load and a second state for blocking the voltage of the load on the basis of the voltage of the load. When the input unit is in the first state, the output unit may hold and output the voltage acquired by the input unit, and when the input unit is in the second state, the output unit may output the voltage held by the output unit while the input unit was in the first state. By the input unit transitioning between the first state and the second state, the output unit can hold the voltage signal applied to the input unit at the peak and can output the held voltage signal to the DC-DC power source. Consequently, the current output circuit can operate stably.

In a current output circuit according to an embodiment, the output unit may include a parallel RC circuit that connects in parallel to the load. This configuration allows the output unit to smooth the voltage signal applied to the input unit and provide the result to the DC-DC power source as feedback. Consequently, the current output circuit can operate stably.

In a current output circuit according to an embodiment, the time constant of the parallel RC circuit may be greater than the period over which the voltage of the load fluctuates. By the time constant being greater than the period over which the load voltage fluctuates, the voltage of the capacitor does not decrease as easily when the input unit has transitioned to the second state. Consequently, the terminal voltage can more easily be held at a voltage near the peak voltage.

In a current output circuit according to an embodiment, the input unit may include a rectifying element. The rectifying element transmits the alternating current (AC) component of the voltage applied to the terminal, thereby allowing the voltage to be held at the peak in the output unit.

In a current output circuit according to an embodiment, the input unit may include a switching element. This configuration can improve the accuracy of the current signal while also reducing power consumption.

The present disclosure can provide a current output circuit that can operate stably regardless of input of a signal from a load, noise, or the like.

As illustrated in FIG. 1, a current output circuit 100 according to an embodiment connects to a measurement apparatus 10. The current output circuit 100 may be included in the measurement apparatus 10. The current output circuit 100 connects to a load 200 of an external apparatus and outputs a current signal to the load 200. It is assumed that one terminal of the load 200 connects to the current output circuit 100 and the other terminal is connected to ground.

The measurement apparatus 10 causes the current output circuit 100 to generate a current signal corresponding to a measurement result. The current output circuit 100 can notify the external apparatus of the measurement result by outputting the current signal corresponding to the measurement result to the load 200. In other words, the measurement apparatus 10 converts the measurement result to a current signal with the current output circuit 100 and outputs the current signal to the load 200 of the external apparatus. The current output circuit 100 can be considered to control the magnitude of current outputted to the load 200 within a predetermined range on the basis of a control instruction from the measurement apparatus 10. The current output circuit 100 can also be considered to output current of a predetermined value that can vary within a predetermined range.

The current output circuit 100 and the load 200 of the external apparatus may be connected by a four-wire system, for example. In the case of a four-wire system, a set of two of the four wires is used for supplying power. Another set of two wires is used for transmitting signals. The current output circuit 100 and the load 200 of the external apparatus may be connected by a two-wire system, for example. In the case of a two-wire system, a set of two wires is used both for supplying power and for transmitting current signals. The configuration of the current output circuit 100 according to the present embodiment may be adopted regardless of whether a four-wire system or a two-wire system is used.

The signal that the measurement apparatus 10 uses for notifying the external apparatus of the measurement result is also referred to as an instrumentation reference signal. The instrumentation reference signal includes a current with a magnitude of at least 4 mA and no more than 20 mA, for example. In other words, the instrumentation reference signal is a current signal having a current whose magnitude is controlled within a predetermined range. The measurement apparatus 10 may, for example, be a pH measurement apparatus. In this case, the structure for converting the measurement result of the pH measurement apparatus into the instrumentation reference signal is also referred to as a liquid converter. The measurement apparatus 10 may be any of various devices other than a pH measurement apparatus. The structure for converting the measurement result of the measurement apparatus 10 into the instrumentation reference signal is also referred to as a converter, a transmitter, or the like. In other words, the current output circuit 100 may be used in a converter, transmitter, or the like. The current output circuit 100 may also be used in a programmable logic controller (PLC), a distributed control system (DCS), or the like.

As illustrated in FIG. 1, the current output circuit 100 according to an embodiment includes a DC-DC power source 110, a current output unit 120, and a voltage detector 130. Each component of the current output circuit 100 is assumed to be grounded. The current output unit 120 and the voltage detector 130 are connected to a terminal of the load 200 via a node 141. The load 200 is connected to the node 141 at one terminal and grounded at the other terminal. The current output unit 120 is connected to the load 200 in series and outputs current to the load 200. The voltage detector 130 is connected to the load 200 in parallel and acquires the voltage of the load 200.

The current output unit 120 operates using the voltage applied by the DC-DC power source 110. The current output unit 120 acquires a control instruction from the measurement apparatus 10 related to the magnitude of current to output. The control instruction from the measurement apparatus 10 may include information related to the measurement result of the measurement apparatus 10 and may include information related to the magnitude of a current signal corresponding to the measurement result. The current output unit 120 generates the current signal on the basis of the control instruction. In other words, the current output unit 120 generates a current signal corresponding to the measurement result of the measurement apparatus 10. The current output unit 120 outputs the generated current signal to the load 200.

The voltage detector 130 acquires the voltage of the load 200. The voltage detector 130 outputs a voltage signal based on the voltage of the load 200 to the DC-DC power source 110. The voltage of the load 200 corresponds to the potential difference between the node 141 and the ground point.

The DC-DC power source 110 applies a voltage to the current output unit 120. The DC-DC power source 110 may be a switching regulator. The voltage applied to the current output unit 120 by the DC-DC power source 110 is also referred to as the output voltage. The DC-DC power source 110 acquires a voltage signal based on the voltage of the load 200 from the voltage detector 130. The DC-DC power source 110 controls the magnitude of the output voltage on the basis of the voltage signal. The DC-DC power source 110 may operate by receiving power from a commercial power source, for example. The DC-DC power source 110 may operate by receiving power from the measurement apparatus 10. The DC-DC power source 110 may operate by receiving power from the external apparatus that includes the load 200.

Figure 2:
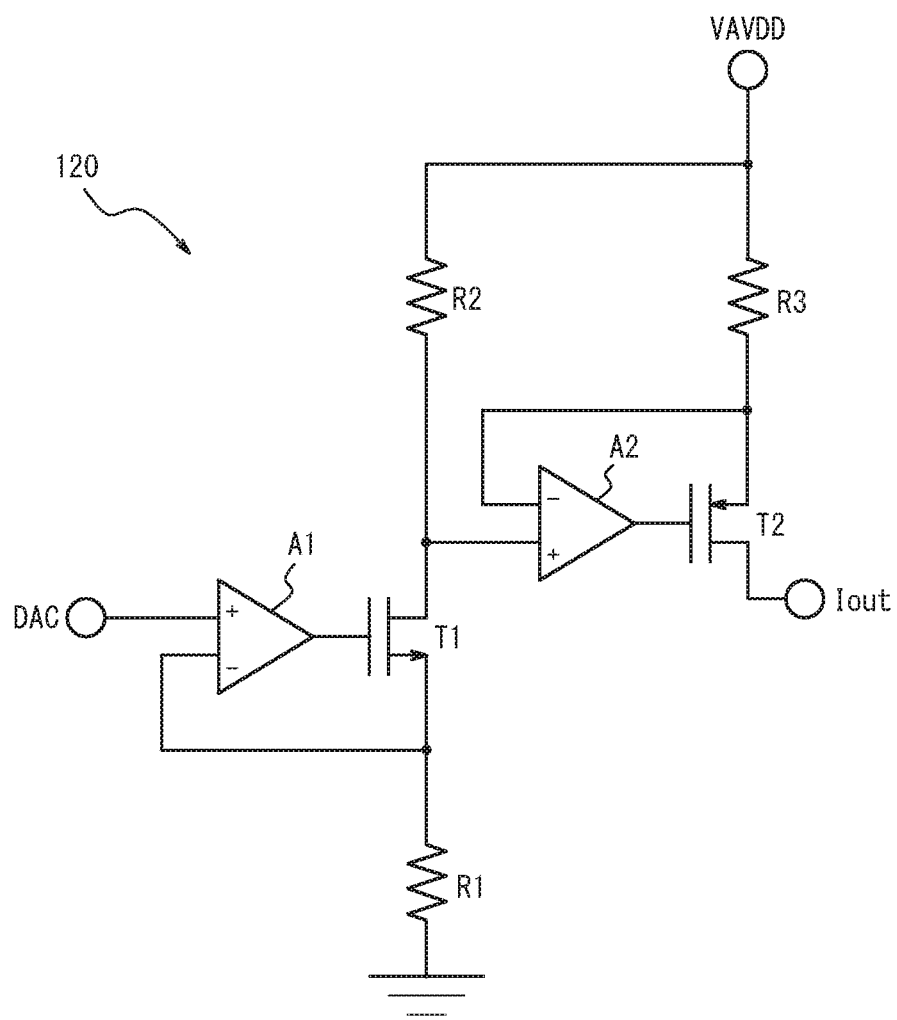
FIG. 2 is a circuit diagram illustrating an example configuration of a current output unit.

As illustrated in FIG. 2, the current output unit 120 according to an embodiment includes operational amplifiers (op-amps) A1 and A2, transistors T1 and T2, and resistors R1, R2, and R3. The op-amp A1, transistor T1, and resistor R1 constitute the low side. The op-amp A2, transistor T2, and resistors R2 and R3 constitute the high side. The current output unit 120 has a voltage input terminal represented as VAVDD. The DC-DC power source 110 applies a voltage to the VAVDD of the current output unit 120. The current output unit 120 has a current output terminal represented as Iout. The current output unit 120 outputs the generated current signal to the load 200 from Iout.

The current output unit 120 includes a signal input terminal represented as DAC (digital analog converter). The DAC acquires a digital signal from the measurement apparatus 10 as a control instruction, converts the digital signal to an analog signal, and outputs the analog signal to the positive input terminal of the op-amp A1. The digital signal acquired from the measurement apparatus 10 may, for example, be a 12-bit or 16-bit digital signal. The digital signal may be a pulse width modulation (PWM) signal. The low side converts the signal inputted from the DAC to a current signal. When the voltage of the analog signal inputted from the DAC is represented as $V_{DAC}$, and assuming that the positive input terminal and the negative input terminal of the op-amp A1 are virtually shorted, the current flowing to the transistor T1 of the low side is represented as $V_{DAC}/R1$, for example.

The current flowing in the low side is transmitted to the high side. In other words, the voltage inputted to the positive input terminal of the op-amp A2 is determined by the voltage applied to the VAVDD, the current flowing in the low side, and the resistor R2. The high side generates the instrumentation reference signal on the basis of the voltage inputted to the positive input terminal of the op-amp A2 and outputs the instrumentation reference signal to the load 200 from the terminal represented as Iout. Assuming that the positive input terminal and negative input terminal of the op-amp A2 are virtually shorted, the current outputted to the load 200 is represented as $(R2/R3) \times (V_{DAC}/R1)$, for example.

When the current output unit 120 outputs a current signal, voltage is applied to the resistor R3 and the transistor T2. The voltage applied to the transistor T2 can include the voltage applied between the drain and the source of the transistor T2. The sum of the voltage of the load 200 and the voltage applied to the resistor R3 and the transistor T2 when the current output unit 120 outputs a current signal based on a control instruction is also referred to as the operating voltage. The output voltage of the DC-DC power source 110 needs to be at least the operating voltage. When the output voltage is less than the operating voltage, the current output unit 120 cannot output a current signal to the load 200 due to a lack of voltage. To account for fluctuations in the output voltage due to disturbances or the like and fluctuations in the voltage of the load 200, the output voltage is set to the sum of the operating voltage and a voltage representing a margin. The margin is also referred to as headroom. When the output voltage includes headroom, the current output unit 120 can stably output a current signal regardless of fluctuations in the output voltage.

A voltage applied between VAVDD and Iout in the current output unit 120 corresponds to the difference between the voltage applied to VAVDD and the load voltage. In other words, as the voltage applied to VAVDD increases, the voltage applied to the current output unit 120 increases. Consequently, as the applied voltage increases, the power consumption of the current output unit 120 may increase. This is also not an effective use of limited power from an exothermic standpoint. On the other hand, headroom needs to be secured for the current output unit 120 to output a current signal stably.

Figure 3:
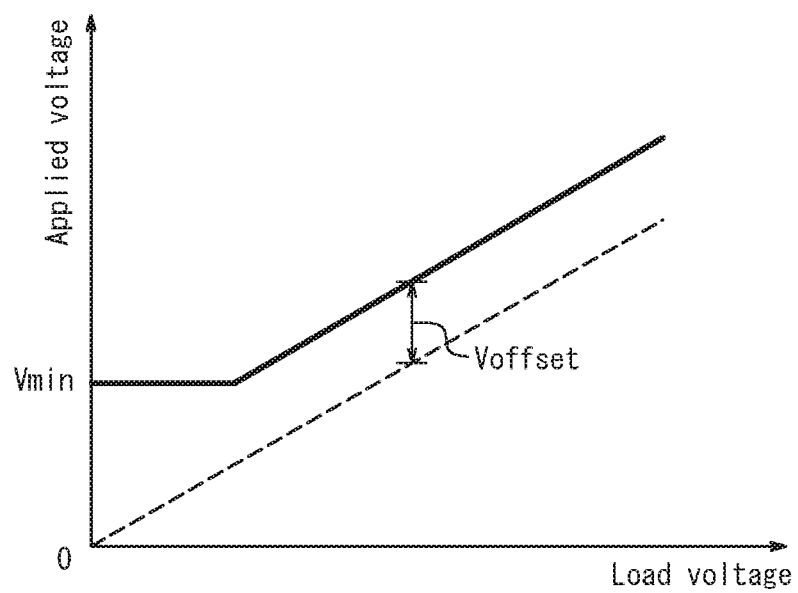
FIG. 3 is a graph illustrating an example relationship between load voltage and applied voltage.

The graph in FIG. 3 illustrates an example relationship between the voltage of the load 200 and the voltage applied to VAVDD. The voltage of the load 200 is also referred to as the load voltage. The voltage applied to VAVDD is also referred to simply as the applied voltage. The horizontal axis represents the load voltage, and the vertical axis represents the applied voltage. The dashed line represents the relationship when the applied voltage and the load voltage are equivalent. The voltage that the DC-DC power source 110 actually applied to the current output unit 120 is the sum of the load voltage and an offset voltage represented as Voffset. The offset voltage may be the sum of the voltage applied to the resistor R3 and the transistor T2 and the voltage corresponding to the headroom. If the load voltage is near zero, the applied voltage can be maintained at or above a minimum voltage (Vmin) necessary for operation of the current output unit 120, regardless of the offset voltage. When the DC-DC power source 110 determines the applied voltage so as to follow fluctuations in the load voltage, headroom can be secured while also allowing stable output of the current signal.

Figure 4:
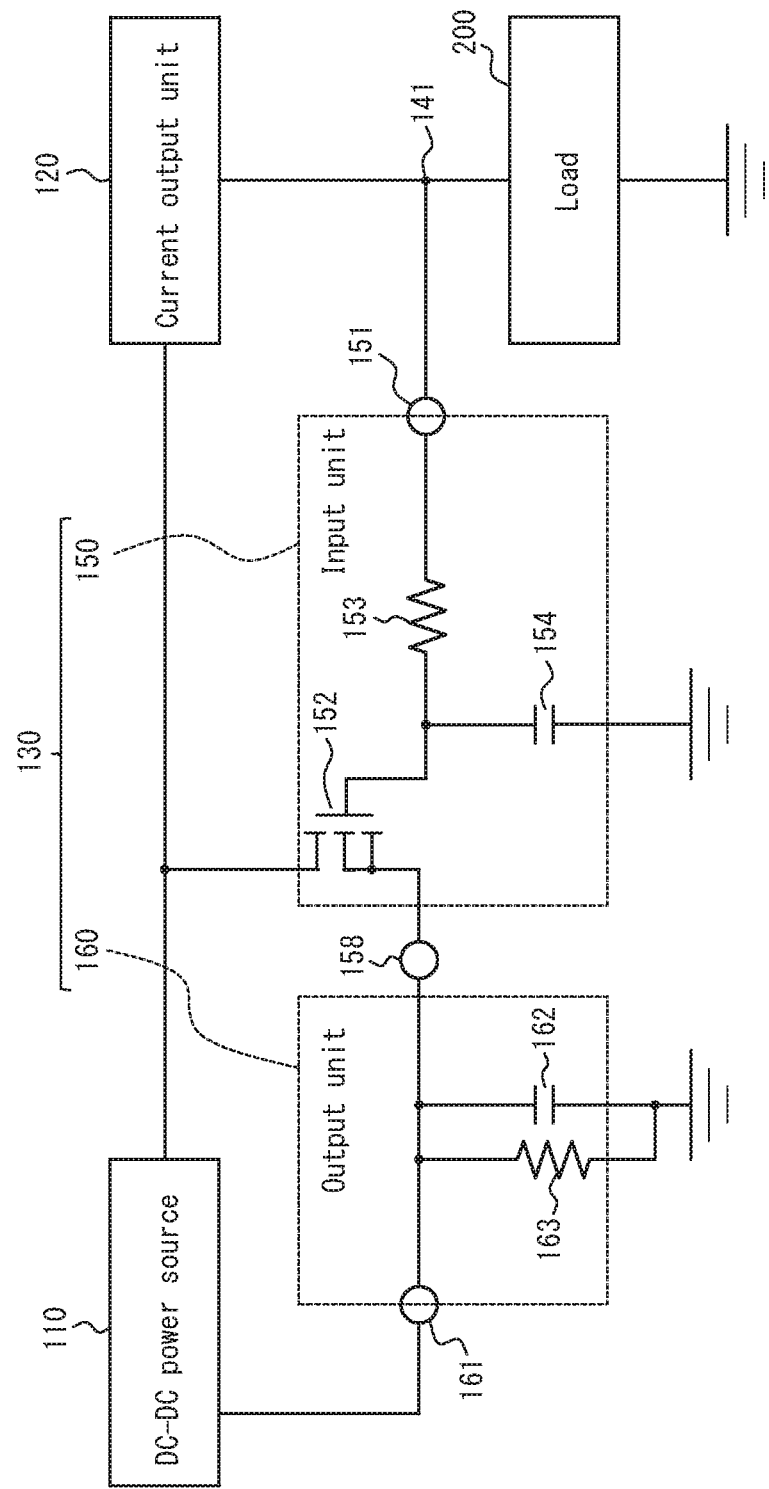
FIG. 4 is a circuit diagram illustrating an example configuration of a voltage detector.

As illustrated in FIG. 4, the voltage detector 130 according to an embodiment includes an input unit 150 and an output unit 160. The input unit 150 includes a terminal 151 that connects to the load 200. The output unit 160 includes a terminal 161 that connects to the DC-DC power source 110. A terminal 158 is assumed to be positioned between the input unit 150 and the output unit 160.

The input unit 150 includes a metal oxide semiconductor field effect transistor (MOSFET) 152. The input unit 150 includes a resistor 153 connected in series between the terminal 151 and the MOSFET 152 and a capacitor 154 connected in parallel with the load 200. The resistor 153 and the capacitor 154 can function as a low-pass filter relative to input of the load voltage. The path from the DC-DC power source 110 passing through the current output unit 120, the node 141, and the terminal 151 of the voltage detector 130 and returning to the DC-DC power source 110 constitutes a positive feedback circuit. In other words, when the voltage of the load 200 inputted to the node 141 increases, then a high voltage is inputted from the voltage detector 130 to the DC-DC power source 110, and the applied voltage to the current output unit 120 increases. Cutting the high-frequency component with the low-pass filter can make the positive feedback circuit less prone to oscillation. In other words, the cutoff frequency of the low-pass filter in the input unit 150 can be determined so that the positive feedback circuit is less prone to oscillation.

The MOSFET 152 is connected at the gate to the low-pass filter formed by the resistor 153 and the capacitor 154, is connected at the drain to the DC-DC power source 110, and is connected at the source to the terminal 158. The MOSFET 152 turns on when the difference between the gate voltage and the source voltage is at least a predetermined threshold voltage.

The output unit 160 includes a capacitor 162 and a resistor 163 that connect in parallel to the load 200. The output unit 160 can be considered to have a parallel resistor-capacitor (RC) circuit that connects in parallel to the load 200.

The MOSFET 152 turns on when the load voltage is at least a predetermined value. While the MOSFET 152 is on, the capacitor 162 of the output unit 160 is charged by the applied voltage from the DC-DC power source 110. The voltage of the terminal 158 increases by the capacitor 162 being charged. In other words, the source voltage of the MOSFET 152 increases. When the voltage of the terminal 158 increases due to charging of the capacitor 162, or when the load voltage decreases, the difference between the gate voltage and the source voltage becomes less than the threshold voltage. The MOSFET 152 turns off in this case. When the MOSFET 152 turns off, the capacitor 162 discharges to the resistor 163. The voltage of the capacitor 162 decreases as a result of discharging. When the voltage of the terminal 158 decreases due to discharging of the capacitor 162, or when the load voltage increases, the difference between the gate voltage and the source voltage becomes equal to or greater than the threshold voltage. The MOSFET 152 turns on again in this case. The capacitor 162 of the output unit 160 thus repeatedly charges and discharges while the MOSFET 152 transitions between being on and being off.

Figure 5:
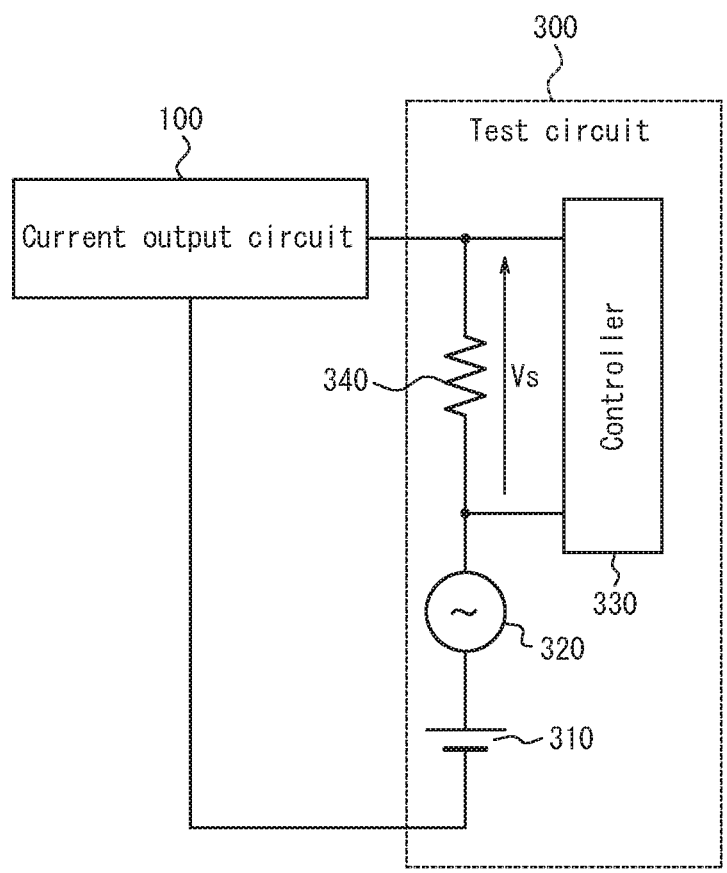
FIG. 5 is a circuit diagram illustrating an example connection between a current output circuit and a test circuit.

Suppose, as illustrated in FIG. 5, that the current output circuit 100 connects to a test circuit 300. The test circuit 300 can function as the load 200. The test circuit 300 includes a DC power source 310, an AC power source 320, a controller 330, and a resistor 340.

The test circuit 300 can output a voltage signal, assumed to be noise or a signal such as a highway addressable remote transducer (HART) signal, to the current output circuit 100. The test circuit 300 can generate the voltage signal to output to the current output circuit 100 using the DC power source 310 and the AC power source 320.

The current output circuit 100 can output an instrumentation reference signal along with a current signal that has a HART signal or the like superimposed thereon to the test circuit 300. Using the controller 330, the test circuit 300 detects the current signal output by the current output circuit 100 as the voltage of the resistor 340.

It is assumed here that the test circuit 300 outputs a voltage signal used in a test relating to HART signal communication to the current output circuit 100. The voltage signal used in the test is assumed to be a voltage signal that includes a DC voltage component and an AC voltage component.

Figure 6:
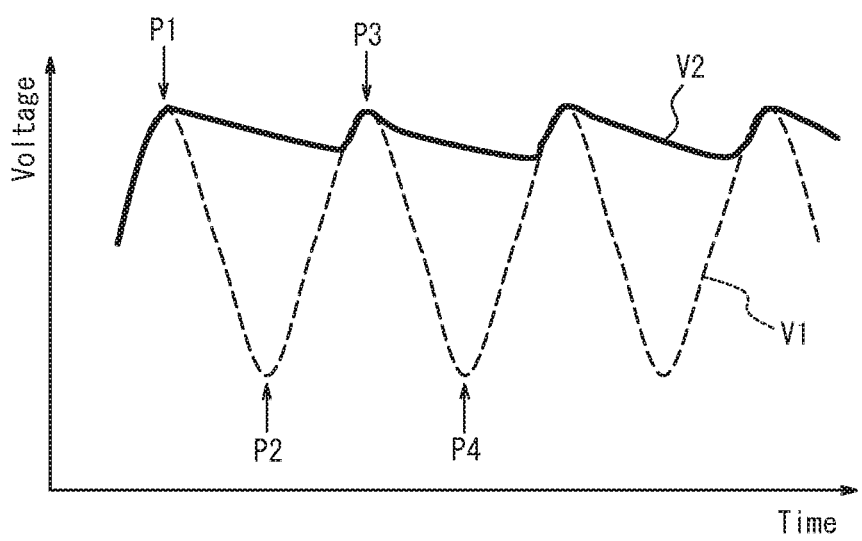
FIG. 6 is a graph illustrating an example relationship between input voltage and output voltage of a voltage detector.

The graph in FIG. 6 illustrates the voltage signal applied to the terminal 151 of the voltage detector 130 from the test circuit 300 in FIG. 5 and the fluctuation in the voltage of the terminal 158 based on the voltage signal. In the graph in FIG. 6, the horizontal axis represents time, and the vertical axis represents voltage. An example of the waveform of the voltage signal applied to the terminal 151 is indicated by the dashed line. An example of fluctuation in the voltage of the terminal 158 is indicated by the solid line.

When the voltage applied to the terminal 151 initially rises (P1 in FIG. 6), the gate voltage of the MOSFET 152 becomes higher than the source voltage. The MOSFET 152 therefore turns on. The capacitor 162 is charged by the MOSFET 152 being on. Consequently, the voltage of the terminal 158 approaches the voltage of the terminal 151.

Next, when the voltage applied to the terminal 151 drops (P2 in FIG. 6), the gate voltage of the MOSFET 152 becomes lower than the source voltage. The MOSFET 152 therefore turns off. In this case, the capacitor 162 discharges to the resistor 163. The voltage of the terminal 158 decreases as a result of discharging of the capacitor 162.

When the voltage applied to the terminal 151 rises again and becomes higher than the voltage of the terminal 158 (P3 in FIG. 6), the MOSFET 152 turns on. While the MOSFET 152 was off, the voltage of the capacitor 162 decreased due to discharging. However, by the MOSFET 152 transitioning to being on, the voltage of the capacitor 162 rises due to charging. As the time constant of the parallel RC circuit is greater, the rate of decrease in the voltage of the capacitor 162 is slower. In other words, appropriately setting the time constant allows the voltage of the capacitor 162 to be held near the peak voltage while the MOSFET 152 is off.

Next, when the voltage applied to the terminal 151 drops (P4 in FIG. 6), the MOSFET 152 turns off. Like the state at P2 in FIG. 6, the voltage of the terminal 158 drops due to discharge of the capacitor 162 but can be held near the peak voltage.

As seen in the example in FIG. 6, the voltage detector 130 according to the present embodiment holds the voltage signal inputted to the terminal 151 at or near the peak value of the voltage signal. In other words, the voltage of the terminal 158 is held at the peak by the output unit 160. The voltage detector 130 outputs the voltage of the terminal 158 to the DC-DC power source 110 from the terminal 161. In other words, the voltage signal that the voltage detector 130 outputs to the DC-DC power source 110 is a voltage signal yielded by holding the voltage signal applied to the terminal 151 at peak voltage. The voltage detector 130 can be considered as smoothing the voltage signal inputted to the terminal 151 near the peak value. When the voltage detector 130 holds the voltage signal applied to the terminal 151 near the peak, the positive feedback circuit is less prone to oscillation even if the cutoff frequency of the low-pass filter is high.

When the MOSFET 152 is on, the input unit 150 can be considered to be in a state of acquiring the voltage signal applied to the terminal 151. The state in which the input unit 150 acquires the voltage signal is also referred to as a first state. When the input unit 150 is in the first state, the output unit 160 holds the voltage signal inputted from the input unit 150 to the terminal 151 as the charging voltage of the capacitor 162 and outputs the voltage signal to the DC-DC power source 110.

When the MOSFET 152 is off, the input unit 150 can be considered to be in a state of blocking the voltage signal applied to the terminal 151. The state in which the input unit 150 blocks the voltage signal is also referred to as a second state. When the input unit 150 is in the second state, the output unit 160 outputs the voltage that was held by the capacitor 162 while the input unit 150 was in the first state to the DC-DC power source 110. In other words, the output unit 160 holds the voltage signal applied to the terminal 151 at the peak voltage and outputs the voltage signal to the DC-DC power source 110.

The input unit 150 can be considered to transition to one of the first state and the second state on the basis of the voltage applied to the terminal 151. By the input unit 150 transitioning between the first state and the second state, the output unit 160 can hold the voltage signal applied to the input unit 150 at the peak and can output the voltage signal to the DC-DC power source 110.

The time constant of the parallel RC circuit in the output unit 160 corresponds to the time for the voltage of the capacitor 162 to decrease to 1/e (e: natural logarithm) due to discharge of the capacitor 162. The time constant of the parallel RC circuit in the output unit 160 may, for example, be set greater than the period over which the load voltage fluctuates. By the time constant being greater than the period over which the load voltage fluctuates, the voltage of the capacitor 162 does not decrease as easily when the input unit 150 has transitioned to the second state. Consequently, the voltage of the terminal 158 can more easily be held at a voltage near the peak voltage.

When the voltage of the terminal 158 is not the peak voltage but rather is held at a voltage near the peak voltage, the voltage provided as feedback from the voltage detector 130 to the DC-DC power source 110 may become lower than the load voltage. The offset voltage may be determined taking into account the difference between the voltage held at the peak in the voltage detector 130 and the load voltage.

Figure 7:
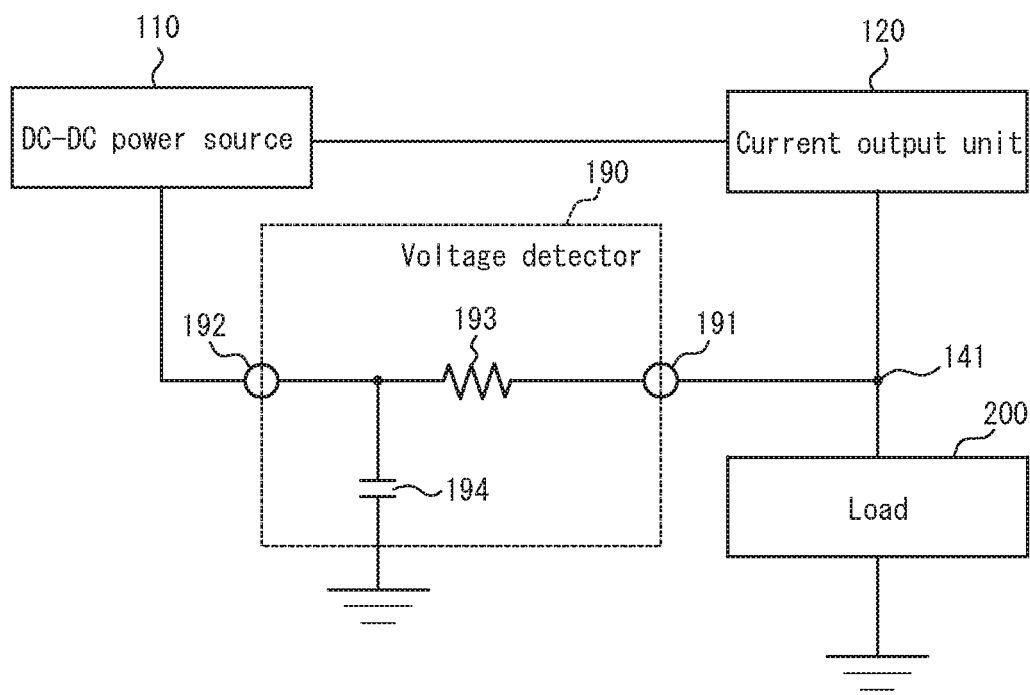
FIG. 7 is a block diagram illustrating a current output circuit according to a comparative example.

A voltage detector 190 according to a comparative example illustrated in FIG. 7 includes a terminal 191 that connects to the load 200, a terminal 192 that connects to the DC-DC power source 110, and a resistor 193 and capacitor 194 that function as a low-pass filter. When the voltage signal applied to the terminal 191 fluctuates in a similar way to the example in FIG. 6, the high-frequency component of the voltage signal applied to the terminal 191 is cut by the low-pass filter.

The voltage detector 190 according to the comparative example does not hold the voltage signal applied to the terminal 191 at the peak voltage. The low-pass filter of the voltage detector 190 according to the comparative example needs to cut a lower frequency for the positive feedback circuit to be less prone to oscillation. In other words, the cutoff frequency of the low-pass filter in the voltage detector 190 according to the comparative example needs to be lower than the cutoff frequency of the low-pass filter in the voltage detector 130 according to the present embodiment. Consequently, the frequency component of the voltage that the voltage detector 190 according to the comparative example outputs from the terminal 192 is limited to being a lower frequency component than the frequency component of voltage that the voltage detector 130 according to the present embodiment outputs from the terminal 161.

The voltage limited to a lower frequency component becomes closer to the DC voltage. In other words, the voltage provided as feedback to the DC-DC power source 110 in the comparative example becomes closer to the DC component and cannot fully follow the fluctuation of the load voltage. Consequently, the output voltage of the DC-DC power source 110 cannot fully follow the fluctuation of the voltage applied to the terminal 191.

Figure 8:
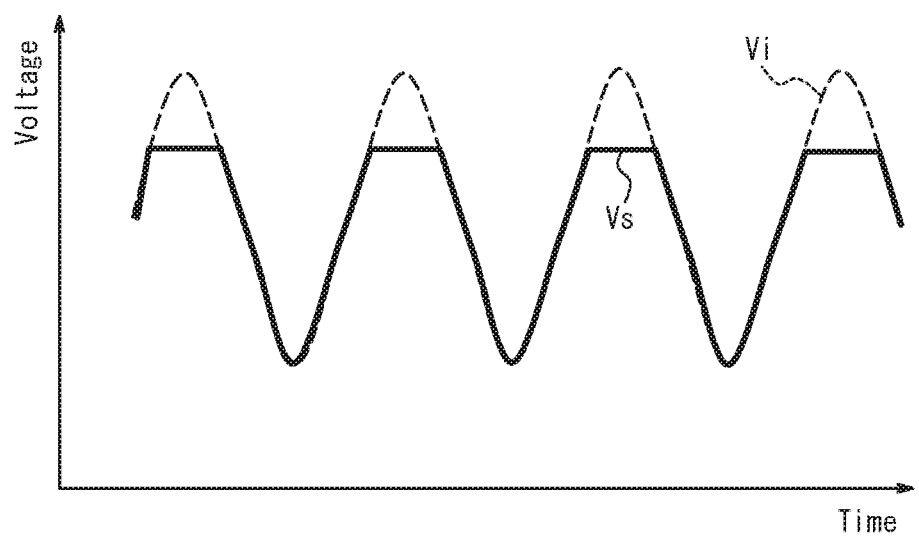
FIG. 8 is a graph illustrating the relationship between input voltage and output voltage in the current output circuit according to the comparative example.

For example, the graph in FIG. 8 illustrates the output of the current output circuit 100 when the same signal as in the example in FIG. 6 is inputted from the test circuit 300 to the voltage detector 190 according to the comparative example. The horizontal axis represents time, and the vertical axis represents voltage. The dashed line labeled Vi represents the voltage signal applied by the DC power source 310 and the AC power source 320 of the test circuit 300. The solid line labeled Vs represents the voltage applied to the resistor 340 of the test circuit 300 by the current signal outputted from the current output circuit 100 to the test circuit 300. Vs is normally expected to follow Vi. However, in the example in FIG. 8, Vs is at saturation when Vi reaches the peak voltage. In other words, the current signal outputted from the current output circuit 100 cannot follow the change in Vi. The reason why Vs cannot follow Vi is that the voltage detector 190 according to the comparative example cuts the high-frequency component of Vi and provides voltage near the DC voltage to the DC-DC power source 110 as feedback.

By contrast, the current output circuit 100 according to the present embodiment includes the voltage detector 130 that provides voltage yielded by holding the load voltage at the peak voltage to the DC-DC power source 110 as feedback. As a result of the voltage detector 130 holding the load voltage at the peak voltage, the cutoff frequency of the low-pass filter in the input unit 150 can be set relatively high. In other words, even when the load voltage has a high-frequency component, the voltage provided as feedback to the DC-DC power source 110 can easily follow the load voltage. Consequently, the output voltage of the DC-DC power source 110 can have sufficient headroom.

Figure 9:
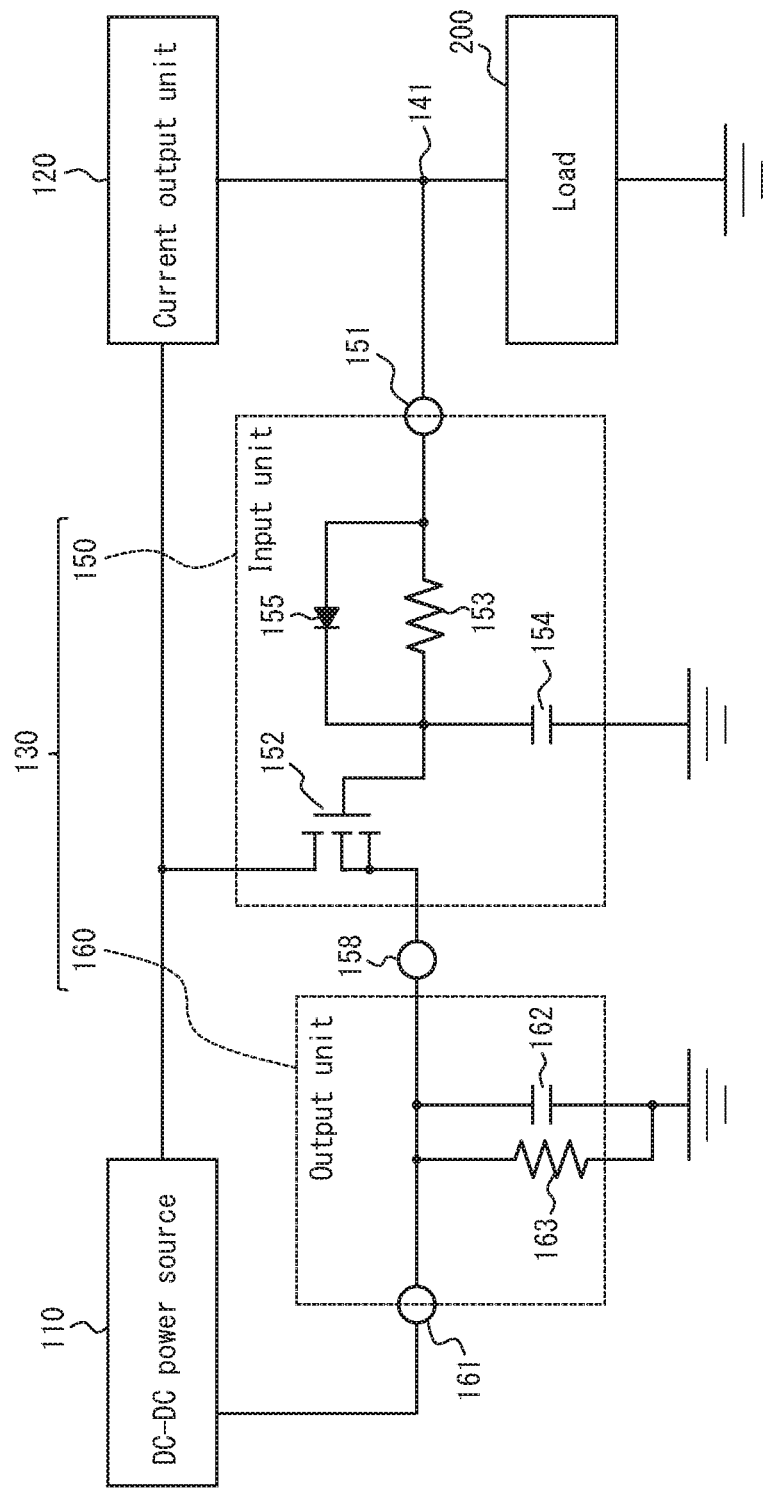
FIG. 9 is a circuit diagram illustrating another example configuration of a voltage detector.

As illustrated in FIG. 9, the input unit 150 of the voltage detector 130 in the current output circuit 100 according to an embodiment may include a diode 155. The diode 155 is connected in parallel with the resistor 153 between the terminal 151 and the terminal 158. The diode 155 can function similarly to the MOSFET 152 in FIG. 4. Consequently, the voltage of the terminal 151 and the voltage of the terminal 158 can change in a similar way to the example in FIG. 6.

When the voltage applied to the terminal 151 initially rises (P1 in FIG. 6), the voltage on the terminal 151 side of the diode 155 becomes higher than the voltage on the terminal 158 side. The diode 155 turns on in this case. The capacitor 162 is charged by the diode 155 being on. Consequently, the voltage of the terminal 158 approaches the voltage of the terminal 151.

Next, when the voltage applied to the terminal 151 drops (P2 in FIG. 6), the voltage on the terminal 151 side of the diode 155 becomes lower than the voltage on the terminal 158 side. The diode 155 therefore turns off. In this case, the capacitor 162 discharges to the resistor 163. The voltage of the terminal 158 drops due to discharge of the capacitor 162 but can be held near the peak voltage.

The diode 155 is connected in parallel to the resistor 153 and the capacitor 154, which function as a low-pass filter. The resistor 153 and the capacitor 154 mainly transmit a DC component of the voltage applied to the terminal 151. In contrast, the diode 155 mainly transmits an AC component of the voltage applied to the terminal 151. Consequently, while the input unit 150 transmits the AC component of the voltage applied to the terminal 151, the voltage can be held at the peak in the output unit 160.

The voltage detector 130 may include one or both of the MOSFET 152 and the diode 155. The diode 155 is also referred to as a rectifying element. The MOSFET 152 is also referred to as a switching element. The switching element is not limited to the MOSFET 152 and may be a switch integrated circuit (IC) or the like. The switching element may be a transistor other than a MOSFET. A MOSFET is easier to use than a junction field effect transistor (JFET) or the like by virtue of having a smaller leakage current at the gate. A smaller leakage current in the switching element can improve the accuracy of the current signal while also reducing power consumption.

The DC-DC power source 110 may be a step-down switching regulator or a step-up switching regulator. When the DC-DC power source 110 is a step-down switching regulator, the DC-DC power source 110 steps down the power-source voltage to the output voltage determined on the basis of the voltage inputted from the voltage detector 130 and applies the result to the current output unit 120. When the DC-DC power source 110 is a step-up switching regulator, the DC-DC power source 110 steps up the power-source voltage to the output voltage determined on the basis of the voltage inputted from the voltage detector 130 and applies the result to the current output unit 120. When the DC-DC power source 110 is a step-up switching regulator, a higher voltage than the power-source voltage can be applied to the current output unit 120. Consequently, the voltage that the DC-DC power source 110 applies to the current output unit 120 can have a higher degree of freedom.

The current output unit 120 in the example in FIG. 2 is a non-inverting amplifier-type constant current circuit but may instead be an inverting amplifier-type constant current circuit. The current output unit 120 illustrated in FIG. 2 is a constant current circuit without a current mirror but may instead be a constant current circuit with a current mirror. The current output unit 120 illustrated in FIG. 2 is a constant current circuit that detects the current on the high side but may instead be a constant current circuit that detects the current on the low side.

In the current output circuit 100 according to the present embodiment, the voltage yielded by holding the load voltage at the peak voltage is provided to the DC-DC power source 110 as feedback. The high-frequency component included in the signal provided as positive feedback is thereby decreased. Consequently, the circuit included in the current output circuit 100 is less prone to oscillation. In the current output circuit 100 according to the present embodiment, the voltage provided as feedback is not a voltage yielded by simply cutting the AC component of the load voltage but rather a voltage smoothed at a voltage near the peak value of the load voltage. Accordingly, even when the load voltage includes a high-frequency component, the output voltage of the DC-DC power source 110 is less prone to falling below the operating voltage.

The output unit 160 of the voltage detector 130 may output voltage to the DC-DC power source 110 via a transistor at the terminal 161. In this case, a path from the DC-DC power source 110 that passes through the transistor connected to the terminal 161 and returns to the DC-DC power source 110 can be established. This path can constitute a negative feedback circuit. In other words, the current output circuit 100 according to the present embodiment can include a multi-loop circuit. Even when the current output circuit 100 includes a multi-loop circuit, oscillation or unstable operation becomes less likely by virtue of peak holding of the voltage provided to the DC-DC power source 110 as feedback.

The load 200 includes a resistor for detecting the current signal from the current output circuit 100 as voltage. The load 200 may include not only a resistor for detecting voltage but also a variety of other circuits. For example, the load 200 may include a thermal dispersion circuit having a transistor for thermal dispersion in the current output unit 120. The load 200 may include a surge protection circuit as protection for when a surge voltage is inputted to the wiring for transmission of the current signal from the current output circuit 100. The load 200 may include an abnormality detection circuit for detecting an abnormality in each part of the load 200. These circuits may increase the impedance of the load 200. The offset voltage may be determined taking into account the voltage applied to these circuits.

Although embodiments of the present disclosure have been described through drawings and examples, it is to be noted that various changes and modifications will be apparent to those skilled in the art on the basis of the present disclosure. Therefore, such changes and modifications are to be understood as included within the scope of the present disclosure. For example, the functions and the like included in the various components may be reordered in any logically consistent way. Furthermore, components may be combined into one or divided.

The invention claimed is:

1. A current output circuit comprising:
   a DC-DC power source configured to control an output voltage;
   a current output unit configured to operate at the output voltage of the DC-DC power source, to generate a current signal based on a control instruction, and to output the current signal to a load; and
   a voltage detector configured to hold a voltage of the load at a peak thereof and output the voltage of the load held at the peak to the DC-DC power source as a voltage signal;
   wherein the DC-DC power source makes the output voltage a sum of the voltage signal and an offset voltage.

2. The current output circuit of claim 1, wherein
   the voltage detector comprises an input unit and an output unit;
   the input unit transitions to one of a first state for acquiring the voltage of the load and a second state for blocking the voltage of the load on a basis of the voltage of the load; and
   when the input unit is in the first state, the output unit holds and outputs the acquired voltage of the load by the input unit, and when the input unit is in the second state, the output unit outputs the voltage held by the output unit while the input unit was in the first state.

3. The current output circuit of claim 2, wherein the output unit comprises a parallel RC circuit that connects in parallel to the load.

4. The current output circuit of claim 3, wherein a time constant of the parallel RC circuit is greater than a period over which the voltage of the load fluctuates.

5. The current output circuit of claim 2, wherein the input unit comprises a rectifying element.

6. The current output circuit of claim 3, wherein the input unit comprises a rectifying element.

7. The current output circuit of claim 4, wherein the input unit comprises a rectifying element.

8. The current output circuit of claim 2, wherein the input unit comprises a switching element.

9. The current output circuit of claim 3, wherein the input unit comprises a switching element.

10. The current output circuit of claim 4, wherein the input unit comprises a switching element.

11. The current output circuit of claim 5, wherein the input unit comprises a switching element.

12. The current output circuit of claim 6, wherein the input unit comprises a switching element.

13. The current output circuit of claim 7, wherein the input unit comprises a switching element.

14. A current output circuit comprising:
   a DC-DC power source configured to control an output voltage;
   a current output unit configured to operate at the output voltage of the DC-DC power source, to generate a current signal based on a control instruction, and to output the current signal to a load; and
   a voltage detector configured to hold a voltage of the load at a peak thereof and output the voltage of the load held at the peak to the DC-DC power source as a voltage signal, wherein
   the DC-DC power source controls the output voltage on a basis of the voltage signal;
   the voltage detector comprises an input unit and an output unit;
   the input unit transitions to one of a first state for acquiring the voltage of the load and a second state for blocking the voltage of the load on a basis of the voltage of the load;
   when the input unit is in the first state, the output unit holds and outputs the acquired voltage of the load by the input unit, and when the input unit is in the second state, the output unit outputs the voltage held by the output unit while the input unit was in the first state, wherein
      the output unit comprises a parallel RC circuit that connects in parallel to the load, and
      a time constant of the parallel RC circuit is greater than a period over which the voltage of the load fluctuates.

15. The current output circuit of claim 14, wherein the input unit comprises a rectifying element.

16. The current output circuit of claim 14, wherein the input unit comprises a switching element.

17. The current output circuit of claim 15, wherein the input unit comprises a switching element.

* * * * *